United States Patent
Onoda et al.

(10) Patent No.: US 7,849,814 B2
(45) Date of Patent: *Dec. 14, 2010

(54) PLASMA GENERATING DEVICE

(75) Inventors: Masatoshi Onoda, Kyoto (JP); Eiji Takahashi, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/519,133

(22) Filed: Sep. 12, 2006

(65) Prior Publication Data

US 2007/0266947 A1   Nov. 22, 2007

Related U.S. Application Data

(63) Continuation of application No. PCT/JP2005/005664, filed on Mar. 22, 2005.

(30) Foreign Application Priority Data

Mar. 26, 2004   (JP) .............................. 2004-091928

(51) Int. Cl.
*H01L 21/00* (2006.01)

(52) U.S. Cl. .............................. 118/723 I; 156/345.48; 118/723 AN

(58) Field of Classification Search ............... 118/723 I, 118/723 IR, 723 AN; 156/345.48, 345.49; 315/111.51
See application file for complete search history.

(56) References Cited

U.S. PATENT DOCUMENTS 5,565,738 A * 10/1996 Samukawa et al. ..... 315/111.51
5,591,493 A * 1/1997 Paranjpe et al. ............. 427/569
6,346,915 B1 * 2/2002 Okumura et al. ............ 343/701

(Continued)

FOREIGN PATENT DOCUMENTS

EP   0 648 069 A1   4/1995

(Continued)

OTHER PUBLICATIONS

English Translation of International Preliminary Report dated Oct. 26, 2006.

(Continued)

*Primary Examiner*—Ram N. Kackar
*Assistant Examiner*—Rakesh Dhingra
(74) *Attorney, Agent, or Firm*—Cheng Law Group, PLLC

(57) ABSTRACT

A plasma generating device provided with a plasma generating chamber (10) and a high-frequency antenna (1) arranged in the chamber (10) for generating inductively coupled plasma by applying a high-frequency power to a gas in the chamber (10) from the antenna (1). The antenna (1) is a low-inductance antenna formed of a first portion (11) extending from the outside of the chamber (10) into the chamber (10), and a plurality of second portions (12) diverging from an inner end (11e) of the first portion (11) in an electrically parallel fashion, and having a termination (12e) directly connected to the inner wall of the grounded chamber (10). The surface of the antenna (1) is coated with an electrically insulating material. Frequency of the high-frequency power applied to the antenna may be in a range from 40 MHz to hundreds of megahertz. The plasma generating device can generate desired plasma by suppressing disadvantages such as abnormal discharge, matching failure and others, and can be constructed so that a desired processing such as film deposition can be performed.

8 Claims, 1 Drawing Sheet

U.S. PATENT DOCUMENTS

| | | | |
|---|---|---|---|
| 7,047,903 B2 * | 5/2006 | Ito | 118/723 I |
| 2001/0008171 A1 * | 7/2001 | Fukuda et al. | 156/345 |
| 2001/0022158 A1 | 9/2001 | Brcka | |
| 2003/0168172 A1 * | 9/2003 | Glukhoy | 156/345.28 |
| 2004/0020432 A1 | 2/2004 | Takagi et al. | |
| 2004/0053479 A1 | 3/2004 | Ito | |
| 2004/0221814 A1 * | 11/2004 | Yeom et al. | 118/723 I |
| 2006/0049138 A1 * | 3/2006 | Miyake et al. | 216/58 |
| 2007/0004111 A1 | 1/2007 | Tomyo et al. | |
| 2007/0007123 A1 | 1/2007 | Takahashi et al. | |
| 2007/0007128 A1 | 1/2007 | Tomyo et al. | |

FOREIGN PATENT DOCUMENTS

| | | |
|---|---|---|
| EP | 1 293 588 | 3/2003 |
| EP | 1 359 611 | 11/2003 |
| JP | 03-068773 A | 3/1991 |
| JP | 07-283143 A | 10/1995 |
| JP | 08-255697 A | 10/1996 |
| JP | 10-074736 A | 3/1998 |
| JP | 10-125663 A | 5/1998 |
| JP | 11-135438 A | 5/1999 |
| JP | 2000-345351 | 12/2000 |
| JP | 2001-035697 | 2/2001 |
| JP | 2002-217119 | 8/2002 |
| JP | 2002-217175 A | 8/2002 |
| JP | 2004-039719 | 2/2004 |
| KR | 2003-0067518 A | 8/2003 |
| TW | 427102 B | 3/2001 |
| WO | WO-99/57746 A1 | 11/1999 |
| WO | WO 01/88221 | 5/2001 |
| WO | WO 02/58121 | 1/2002 |

OTHER PUBLICATIONS

Notification of Reasons for Refusal for the Application No. 2006-519455 from Japan Patent Office mailed Aug. 5, 2008.

Supplementary European Search Report for the Application No. EP 05 72 1591 dated Jul. 8, 2009.

Korean Patent Office Action for the Application No. 2006-7019601 dated Nov. 15, 2007.

* cited by examiner

PLASMA GENERATING DEVICE

CROSS-REFERENCES TO RELATED APPLICATIONS

This application is continuation of application number PCT/JP05/005664 filed Mar. 22, 2005.

TECHNICAL FIELD

The invention relates to a plasma generating device which can be utilized in various devices utilizing plasma and, for example, can be utilized in a plasma CVD device forming a film in gas plasma, a device forming a film by sputtering a sputter target in gas plasma, a plasma etching device performing etching in gas plasma and various plasma-using devices such as a device extracting ions from gas plasma and performing ion implantation or ion doping as well as various devices such as devices utilizing the above devices for producing semiconductor devices or parts thereof, or for producing a liquid crystal display device or parts thereof.

BACKGROUND ART

Various methods have been known for generating gas plasma. Among such methods, a method of generating inductively coupled plasma by using a high-frequency power has been known as a method of obtaining uniform plasma at an extremely high density in a plasma generating chamber. Recently, it has been attempted, e.g., to increase a frequency of a high-frequency power to be applied for improving plasma characteristics.

For the production of such inductively coupled plasma, a high-frequency power is applied to a high-frequency antenna provided for the plasma generating chamber, and the high-frequency antenna is generally arranged outside the plasma generating chamber.

However, Japanese Laid-Open Patent Publication No. 2001-35697 (JP2001-35697A) has proposed a structure, in which the high-frequency antenna is arranged inside the plasma generating chamber for improving utilization efficiency of high-frequency power. For suppressing abnormal discharge and others which may occur when the antenna is arranged inside the plasma generating chamber, the antenna has a planar (two-dimensional) structure formed of a wire-like conductor terminated without circling, and thereby the inductance of the antenna is reduced. Further, in this structure, the antenna is extended outside from the plasma generating chamber, and its termination is grounded via a blocking condenser.

However, according to the proposed high-frequency antenna arranged in the plasma generating chamber, if a frequency of the applied high-frequency power is raised for improving plasma characteristics such as plasma density and others, the inductance of the antenna is still high, e.g., due to the fact that the antenna termination is extended outside from the plasma generating chamber, and therefore such a disadvantage occurs that matching cannot be achieved.

Since the antenna termination is extended outside from the plasma generating chamber, a gas-tight structure must be formed at a portion where the termination passes through a wall of the plasma generating chamber.

Since the antenna has a planar structure, the antenna may be arranged near the chamber wall for efficiently utilizing an inner space of the plasma generating chamber, and this arrangement is probably employed in many cases. According to this arrangement, a large portion of the high-frequency electric field applied from the antenna is directed to the chamber wall, and this lowers the utilization efficiency of the high-frequency power.

Accordingly, an object of the invention is to provide a plasma generating device provided with a plasma generating chamber and a high-frequency antenna arranged in the plasma generating chamber for generating inductively coupled plasma by applying a high-frequency power to a gas in the plasma generating chamber from the high-frequency antenna, and particularly to provide a plasma generating device which can reduce an inductance of the high-frequency antenna and can generate desired plasma by suppressing disadvantages such as abnormal discharge, matching failure and others as compared with the same kind of conventional device, and can generate the desired plasma by suppressing disadvantages such as abnormal discharge, matching failure and others even when a frequency of the high-frequency power to be applied is raised for improving the plasma characteristics.

Another object of the invention is to provide a plasma generating device which can achieve the above object, and can perform intended processing such as film deposition.

DISCLOSURE OF THE INVENTION

The invention provides a plasma generating device provided with a plasma generating chamber and a high-frequency antenna arranged in the plasma generating chamber for generating inductively coupled plasma by applying a high-frequency power to a gas in the plasma generating chamber from the high-frequency antenna. The high-frequency antenna extends from the outside of the plasma generating chamber into the plasma generating chamber, and has portions diverging in an electrically parallel fashion in the plasma generating chamber. A termination of each of the diverging portions is directly connected to the plasma generating chamber. The plasma generating chamber bears a potential set to a ground potential.

In the plasma generating device according to the invention, the portion of the high-frequency antenna located outside the plasma generating chamber does not contribute to plasma production so that this outside portion can be directly connected to a matching box in a high-frequency power applying device while minimizing the length of this portion. Also, the antenna termination is not extended to the outside of the plasma generating chamber, and is directly connected to the plasma generating chamber so that the whole length of the antenna can be short. Further, the antenna diverges in the electrically parallel fashion in the plasma generating chamber, and thus employs a parallel wiring structure so that an inductance of the antenna can be reduced.

Thereby, the plasma generating device can generate desired plasma by suppressing disadvantages such as abnormal discharge, matching failure and others as compared with the prior art, and can generate the desired plasma by suppressing disadvantages such as abnormal discharge, matching failure and others even when a frequency of the applied high-frequency power is raised for improving the plasma characteristics.

The high-frequency antenna may have a portion located inside the plasma generating chamber and surrounded by a shield member for confining the plasma so as to generate the plasma at a higher density. The shield member may be made of an electrically conductive material such as aluminum or stainless steel. The shield member functions as an anti-adhesion member for suppressing unnecessary adhesion of a film onto an inner wall of the plasma generating chamber when the plasma generating chamber is utilized for the film formation or deposition as will be described later.

It is preferable that the high-frequency antenna has a compact structure for reducing a required space in the plasma generating chamber, and can achieve high efficiency of utilizing the high-frequency power. For this, the high-frequency antenna may have a three-dimensional structure. As a typical example, the high-frequency antenna may include a first portion extending from the outside of the plasma generating chamber through a wall of the plasma generating chamber into the plasma generating chamber, and a plurality of second portions diverging and extending radially from an end of the first portion inside the plasma generating chamber toward the plasma generating chamber wall, and a termination of each of the second portions may be directly connected to the plasma generating chamber wall.

Even in the case where the high-frequency antenna of the above structure is arranged near the plasma generating chamber wall, it can apply an induction field to regions surrounding the first and second portions of the antenna to a higher extent than an antenna of a planar structure arranged parallel to the chamber wall. Therefore, the antenna can efficiently apply the electric field over a wide range in the plasma generating chamber, and can improve the efficiency of utilizing the high-frequency power.

A group of the second portions of the above antenna may have a U-shaped form, a vertically opening quadrilateral-shaped form or a semicircular form as a whole, or may have another form such as a combination of antenna portions of one of the above forms angularly spaced from each other around the first portion in a crossing fashion or the like.

In any one of the above structures, it is preferable that a surface of at least a conductor portion of the high-frequency antenna located in the plasma generating chamber is coated with an electrically insulating material such as alumina for suppressing disadvantages such as plasma etching with self-bias.

In any one of the above structures, the high-frequency power applied to the high-frequency antenna may have a commercial frequency of 13.56 MHz. However, the plasma generating device according to the invention employs the high-frequency antenna of a low inductance as already described so that the frequency may be in a range, e.g., from about 40 MHz to about 100 MHz, and specifically equal to, e.g., about 60 MHz, or may be equal to a higher value, e.g., equal to hundreds of megahertz. The device can use the high-frequency power of such a high frequency, and thereby can improve the plasma characteristics such as plasma density.

The plasma generating device according to the invention can be utilized in various plasma processing devices utilizing plasma and, for example, can be utilized in a plasma CVD device forming a film in gas plasma, a device forming a film by sputtering a sputter target in gas plasma, a plasma etching device performing etching in gas plasma and various plasma-using devices such as a device extracting ions from gas plasma and performing ion implantation or ion doping as well as various devices such as devices utilizing the above processing devices for producing semiconductor devices or parts thereof, or for producing a liquid crystal display device or parts thereof.

For example, a gas supply device is arranged for supplying a gas to be used for film formation into the plasma generating chamber, a work holder is arranged in the plasma generating chamber, and the high-frequency antenna applies the high-frequency power to the gas supplied from the gas supply device into the plasma generating chamber to generate inductively coupled plasma so that a film may be formed on a film deposition target held on the work holder in the plasma generating chamber.

For example, the gas supply device may be a device supplying a silane gas and a hydrogen gas so that a silicon film can be formed on the film deposition target in the plasma of the silane and hydrogen gases. In this case, a quantity of each of the silane and hydrogen gases supplied into the plasma generating chamber, a deposition gas pressure in the plasma generating chamber, a high-frequency power (frequency and power) applied to the gases and others may be controlled so that a crystalline silicon film such as a polycrystalline silicon film can be formed.

As described above, the invention provides the plasma generating device provided with the plasma generating chamber and the high-frequency antenna arranged in the plasma generating chamber for generating inductively coupled plasma by applying the high-frequency power to the gas in the plasma generating chamber from the high-frequency antenna. Particularly, the invention provides the plasma generating device which can reduce the inductance of the high-frequency antenna to a higher extent than the same kind of conventional devices, thereby can generate desired plasma by suppressing disadvantages such as abnormal discharge and matching failure, and can generate the desired plasma by suppressing disadvantages such as abnormal discharge and matching failure even when the frequency of the applied high-frequency power is raised for improving the plasma characteristics.

The number, arrangement, direction and others of the high-frequency antenna(s) used according to the invention are appropriately determined as required.

The invention also can provide a plasma generating device performing intended processing such as film formation while achieving the above advantages.

PREFERRED EMBODIMENTS FOR IMPLEMENTING THE INVENTION

A plasma generating device, which is an example of the plasma generating device according to the invention and can be utilized as a film deposition device, will now be described with reference to the drawings.

A plasma generating device (film deposition device) in the figure includes a plasma generating chamber 10 for use as a film deposition chamber. A work holder 3, a high-frequency antenna 1 located above the holder 3 and a shield member 2 surrounding the antenna 1 are arranged in the plasma generating chamber 10.

The film deposition chamber 10 is grounded.

Figure 1:
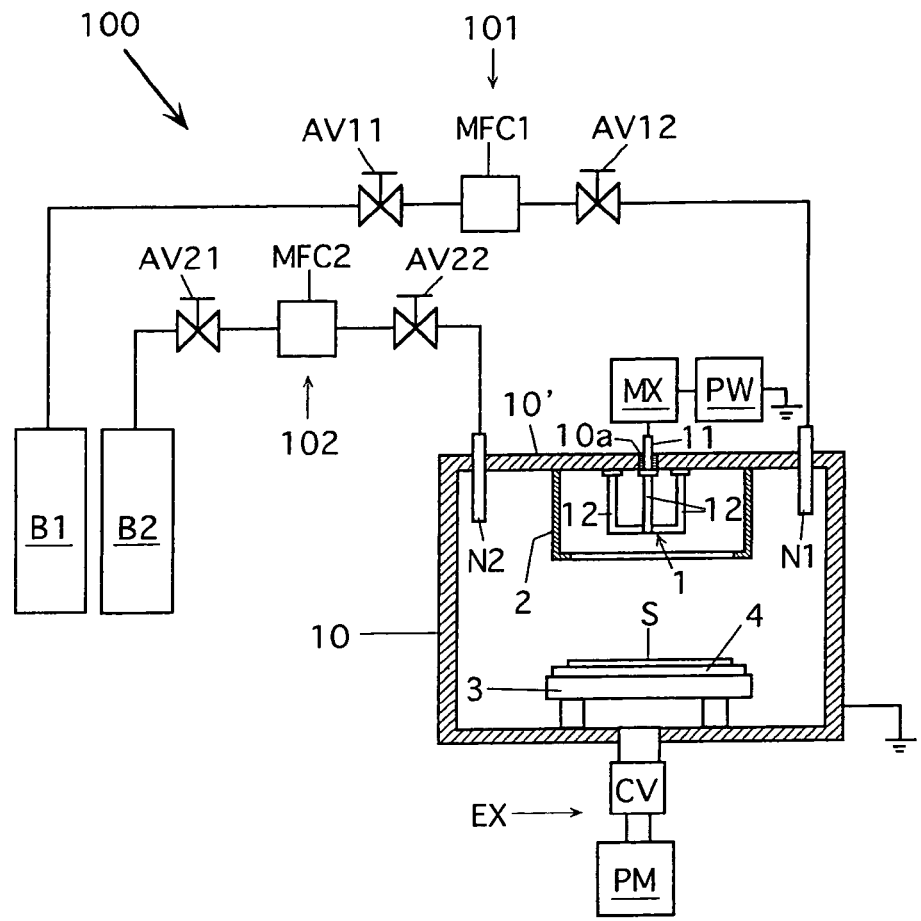
FIG. 1 shows a schematic structure of an example of a plasma generating device according to the invention.
Figure 2:
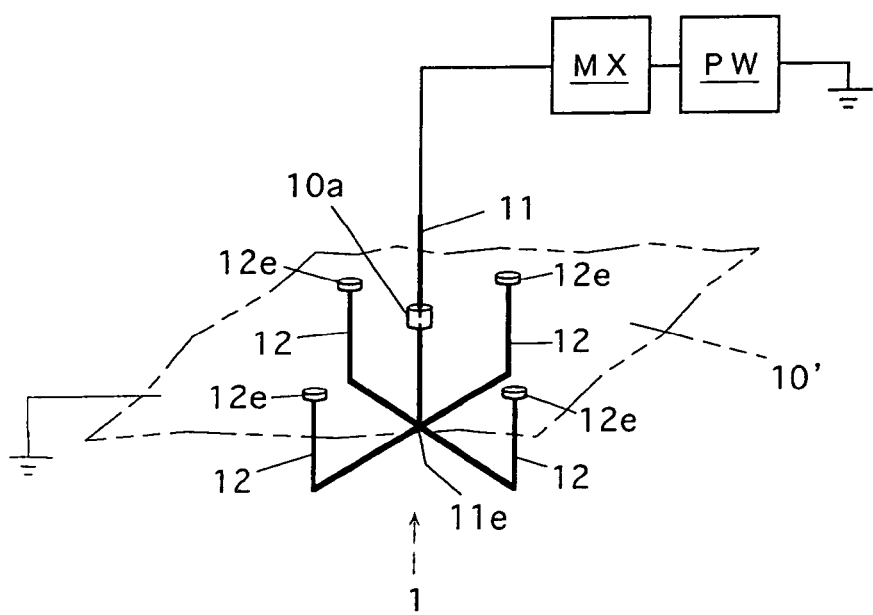
FIG. 2 shows an example of a three-dimensional structure of a high-frequency antenna.

The high-frequency antenna 1 has a three-dimensional structure as shown in FIGS. 1 and 2, and is formed of a first portion 11 and a plurality of second portions 12. The first portion 11 extends in a straight rod-like form from the outside of the plasma generating chamber (film deposition chamber) 10 through its top wall 10' into the chamber 10. The second portion 12 diverges and extends radially from an inner end 11e of the first portion 11 located in the chamber 10 toward the top wall 10'. An termination 12e of each second portion 12 is directly connected to the top wall 10' by a connector, and therefore is grounded via the chamber 10.

As a whole, the group of second portions 12 has such a form that two antenna portions each having a substantially U-shaped form are combined together to exhibit a crossing form in a plan view, and is coupled to the first portion 11.

A surface of an antenna conductor of the high-frequency antenna 1 is coated with an insulating film (alumina film in this embodiment).

The first portion 11 of the high-frequency antenna 1 is connected to a high-frequency power source PW via a matching box MX. The matching box MX and the power source PW form a high-frequency power applying device. The first portion 11 has a portion which is located outside the chamber 10 without contributing to plasma production. This portion is extremely short, and is directly connected to the matching box MX. The first portion 11 extends through an insulating member 10a which is arranged at the top wall 10' of the chamber 10, and serves also as gas-tight sealing.

As described above, the high-frequency antenna 1 has a short size, and has a parallel wiring structure diverging in an electrically parallel fashion in the chamber 10. Owing to these structures, the inductance of the antenna 1 is reduced.

The work holder 3 has a heater 4 heating the work (a substrate S in this example). The work holder 3 is grounded together with the chamber 10.

The shield member 2 in this embodiment has a cylindrical form, is made of an electrically conductive material such as aluminum and is opened toward the holder 3. The shield member 2 is employed for confining the plasma and thereby producing the plasma at higher density, and for suppressing unnecessary adhesion of the film onto the chamber wall, but is not essential.

In addition to the members, portions and others already described, a gas supply device 100 and an exhaust device EX are also employed for the plasma generating chamber (film deposition chamber) 10.

The gas supply device 100 includes a silane gas ($SiH_4$) supply circuit 101 and a hydrogen gas supply circuit 102.

The exhaust device EX is formed of a conductance valve CV controlling an exhaust flow rate and a vacuum pump PM connected to the chamber 10 via a pipe and the valve CV.

The silane gas supply circuit 101 is formed of a gas inlet nozzle N1 arranged through the top wall 10' of the chamber 10 as well as an electromagnetic on-off valve AV12, a massflow controller MFC1, an electromagnetic on-off valve AV11 and a silane gas ($SiH_4$) cylinder or container B1 which are successively connected to the nozzle N1 via pipes.

The hydrogen gas supply circuit 102 is formed of a gas inlet nozzle N2 arranged through the top wall 10' of the chamber 10 as well as an electromagnetic on-off valve AV22, a massflow controller MFC2, an electromagnetic on-off valve AV21 and a hydrogen gas cylinder or container B2 which are successively connected to the nozzle N2 via pipes.

According to the plasma generating device (film deposition device) already described, a silicon film can be formed on the substrate S, e.g., in the following manner.

First, a work inlet/outlet (not shown) of the chamber 10 is opened, the deposition target substrate S is placed on the work holder 3 and then the work inlet/output is closed in a gas-tight fashion. Then, the pump PM of the exhaust device EX operates to discharge the gas from the chamber 10.

When the pressure in the chamber 10 decreases to a predetermined pressure, the valves AV11 and AV12 of the silane gas supply circuit 101 open to supply the silane gas into the chamber 10 at a flow rate controlled by the massflow controller MFC1, and also, the valves AV21 and AV22 of the hydrogen gas supply circuit 102 open to supply the hydrogen gas into the chamber 10 at a flow rate controlled by the massflow controller MFC2 so that the deposition pressure is kept in the chamber. Further, the high-frequency antenna 1 is supplied with the high-frequency power from the power source PW via the matching box MX, and thereby the supplied gas is excited to produce an inductively coupled plasma. When necessary, the heater may heats the substrate S. In the above manner, the silicon film is formed over the substrate S on the holder 3 in the inductively coupled plasma.

In the above film deposition processing, since the high-frequency antenna 1 is the low inductance antenna as described above, the desired plasma can be generated while suppressing disadvantages such as abnormal discharge, matching failure and others. Even in the case where the frequency of the high-frequency power is raised, e.g., to a range of 40 MHz to 100 MHz for improving the plasma characteristics, the desired plasma can be generated while suppressing disadvantages such as abnormal discharge, matching failure and others.

Since the high-frequency antenna 1 has the three-dimensional structure, it can efficiently apply the electric field over a wide range in the chamber 10 even when the antenna 1 is arranged near the chamber wall. This improves the efficiency of utilizing the high-frequency power.

Since the surface of the high-frequency antenna 1 is coated with the insulating material, it is possible to suppress disadvantages such as etching with the plasma due to the self-bias.

An example of an experiment of forming a crystalline silicon thin film will now be described.

The conditions are as follows:
Substrate: non-alkali glass substrate
Substrate temperature: 400 deg. C. (400° C.)
High-frequency power supply: 60 MHz, 4000 W
Silane gas supply quantity: 1 sccm
Hydrogen gas supply quantity: 150 sccm
Deposition pressure: 0.67 Pa
Film thickness: about 500 angstroms (about 500 Å)

A crystallinity of the film obtained in this example was evaluated by laser Raman spectroscopic analysis. According to the result, a peak exhibiting the crystallinity of Raman shift 520 $cm^{-1}$ was present, and the crystallinity was confirmed.

INDUSTRIAL APPLICABILITY

The invention can be utilized in various fields requiring the plasma production and, for example, in the plasma CVD device, plasma etching device and devices of extracting ions from the gas plasma for ion implantation or ion doping.

What is claimed is:

1. A plasma generating device provided with a plasma generating chamber and a high-frequency antenna arranged in said plasma generating chamber for generating inductively coupled plasma by applying a high-frequency power to a gas in said plasma generating chamber from said high-frequency antenna, wherein said high-frequency antenna extends from the outside of said plasma generating chamber into said plasma generating chamber, and has portions diverging in an electrically parallel fashion in said plasma generating chamber, a termination of each of said diverging portions is directly connected to an inner wall of said plasma generating chamber, and said plasma generating chamber bears a potential set to a ground potential, wherein said high-frequency antenna has a portion located inside the plasma generating chamber and surrounded by a shield member made of an electrically conductive material with an empty space between the portion of the antenna and the shield member, wherein said high-frequency antenna has a three-dimensional structure and is formed of a first portion extending from the outside of said plasma generating chamber through a wall of said plasma generating chamber into said plasma generating chamber, and a plurality of second portions diverging and extending radially from an end of said first portion inside the plasma generating chamber and further extending and returning toward said plasma generating chamber wall through which said first portion extends, and a termination of each of said second portions is directly connected to the inner wall of the plasma generating chamber, and wherein the plurality of second portions do not extend to the outside of the plasma generating chamber.

2. The plasma generating device according to claim 1, wherein said shield member is made of an electrically conductive material and extends and is opened in the opposite direction to said plasma generating chamber wall through which said first portion of said high-frequency antenna extends.

3. The plasma generating device according to claim 1, wherein a group of said plurality of second portions of said high-frequency antenna has such a form as a whole that two antenna portions each having a substantially U-shaped form are combined together to exhibit a crossing form in a plan view, and is coupled to said first portion of said high-frequency antenna.

4. The plasma generating device according to any one of claims 1, 2 and 3, wherein a surface of at least a conductor portion of said high-frequency antenna located in said plasma generating chamber is coated with an electrically insulating material.

5. The plasma generating device according to any one of claims 1, 2 and 3, further comprising a high-frequency power applying device applying the high-frequency power to said high-frequency antenna, wherein said high-frequency power applying device applies the high-frequency power of a frequency in a range from forty megahertz to hundreds of megahertz to the high-frequency antenna.

6. The plasma generating device according to any one of claims 1, 2 and 3, further comprising a gas supply device supplying a gas to be used for film formation into said plasma generating chamber, and a work holder arranged in said plasma generating chamber, wherein said high-frequency antenna applies the high-frequency power to the gas supplied from said gas supply device into said plasma generating chamber to generate inductively coupled plasma such that a film is formed on a film deposition target held on said work holder in the plasma generating chamber.

7. The plasma generating device according to claim 6, wherein said gas supply device is a device supplying a silane gas and a hydrogen gas, and a silicon film can be formed on said film deposition target in the plasma of said silane and hydrogen gases.

8. The plasma generating device according to any one of claims 1, 2 and 3, wherein the plurality of second portions are not located on the same plane.

* * * * *